United States Patent
Kawahara et al.

(10) Patent No.: US 9,455,222 B1
(45) Date of Patent: Sep. 27, 2016

(54) IC HAVING FAILSAFE FUSE ON FIELD DIELECTRIC

(71) Applicant: Texas Instruments Incorporated, Dallas, TX (US)

(72) Inventors: Hideaki Kawahara, Plano, TX (US); Hong Yang, Richardson, TX (US); Eugen Pompiliu Mindricelu, Dallas, TX (US); Robert Graham Shaw, Nashua, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/974,834

(22) Filed: Dec. 18, 2015

(51) Int. Cl.
| | | |
|---|---|---|
| H01L 23/62 | (2006.01) | |
| H01L 23/525 | (2006.01) | |
| H01L 27/06 | (2006.01) | |
| H01L 23/532 | (2006.01) | |
| H03F 3/45 | (2006.01) | |

(52) U.S. Cl.
CPC ..... *H01L 23/5256* (2013.01); *H01L 23/53214* (2013.01); *H01L 23/53257* (2013.01); *H01L 23/53271* (2013.01); *H01L 27/0629* (2013.01); *H01L 27/0647* (2013.01); *H03F 3/45071* (2013.01); *H03F 2203/45041* (2013.01); *H03F 2203/45538* (2013.01)

(58) Field of Classification Search
None
See application file for complete search history.

(56) References Cited

U.S. PATENT DOCUMENTS

| | | | |
|---|---|---|---|
| 5,146,307 A | 9/1992 | Kaya | |
| 6,911,360 B2 * | 6/2005 | Li | H01L 23/5256 257/379 |
| 9,318,433 B2 * | 4/2016 | Toyoda | H01L 23/5256 |
| 2005/0156275 A1 * | 7/2005 | Hsieh | H01L 23/5258 257/529 |
| 2011/0089494 A1 * | 4/2011 | Egawa | H01L 23/5258 257/360 |
| 2011/0108926 A1 * | 5/2011 | Bahl | H01L 27/112 257/379 |
| 2011/0140185 A1 * | 6/2011 | Nishimura | G01R 31/2884 257/296 |
| 2011/0241086 A1 * | 10/2011 | Kurz | H01L 23/5256 257/288 |
| 2012/0211841 A1 * | 8/2012 | Kurjanowicz | G11C 17/16 257/369 |
| 2016/0042904 A1 * | 2/2016 | Hou | H01H 85/36 337/407 |

\* cited by examiner

*Primary Examiner* — Alexander Ghyka
(74) *Attorney, Agent, or Firm* — Charles A. Brill; Frank D. Cimino

(57) ABSTRACT

A fuse circuit includes a substrate, a top semiconductor layer doped a first conductivity type having a well doped a second conductivity type formed therein including a well contact. A field dielectric layer (FOX) is on the semiconductor layer. A fuse is on the FOX within the well including a fuse body including electrically conductive material having a first and second fuse contact. A transistor is formed in the semiconductor layer including a control terminal (CT) with CT contact, a first terminal (FT) with FT contact, and a second terminal (ST) with a ST contact. A coupling path is between the CT contact and well contact, a first resistor is coupled between the FT contact and CT contact, and a coupling path is between the ST contact and the first fuse contact.

18 Claims, 4 Drawing Sheets

IC HAVING FAILSAFE FUSE ON FIELD DIELECTRIC

FIELD

Disclosed embodiments relate to fuses on semiconductor integrated circuit (IC) devices.

BACKGROUND

Fuses are implemented in various process technology for a variety of different semiconductor IC devices. For example, polysilicon fuses can be used for programming memory devices such as programmable read-only memories (PROM), programmable logic arrays (PLA), and redundancy memory arrays. Fuse arrays are typically formed during the manufacturing of these memory devices, generally formed on a field oxide layer that may be 1 µm or more in thickness. The fuses in the PROM or PLA devices are used to customize it for a specific application. A PROM or PLA device is programmed by opening (or blowing) the appropriate fuses in selected memory cells. In connection with redundancy memory arrays, fuses are used to replace defective memory cells with spare substitute memory cells which were fabricated in the array during the same manufacturing process.

A fuse circuit can also be used by an analog circuit, such as a resistor ladder (resistor trimming network) to adjust circuit's performance. The fuse in this case allows tuning by adjusting a circuit passive parameter by opening one or more links in the resistor ladder.

In order to blow the fuse, which typically comprises a metal or polysilicon body (link) having respective contacts across the link, an electrical method is utilized where a voltage is applied across the link and the current as a result is driven through the link with a current level based the resistance of the link material. Due to resistive heating, the link material heats to beyond its melting point which causes evaporation that results in a break in the link to occur. Polysilicon fuses are known to need less current than a metal fuse to open (break) during programming.

For some ICs there can be a constraint on the field oxide thickness selection to place the fuse on. For one example, the process used may have only a thin field oxide layer (e.g. only 1,000 Å (=0.1 µm) of field oxide (FOX)) available. Damaging the FOX layer is a concern during fuse blowing, particularly for thin FOX layer which is most susceptible to damage, because cracking or other physical damage to the FOX layer can be caused by the physical stress occurring during fuse blowing. FOX damage can cause leakage-based IC reliability degradation, such as due to shorting of a contact of the fuse to the silicon substrate through the thin FOX layer under the fuse as a worst case problem.

SUMMARY

This Summary briefly indicates the nature and substance of this Disclosure. It is submitted with the understanding that it will not be used to interpret or limit the scope or meaning of the claims.

Disclosed embodiments recognize a problem for conventional fuses (e.g., polysilicon fuses) on thin dielectrics, such as a thin field oxide (FOX) layer, is that the body of the fuse after electrical fuse blowing can cause one or both fuse contacts to be shorted to the semiconductor (e.g., silicon) underneath the fuse through a damaged FOX layer. Disclosed fuse circuits place the fuse on a FOX layer that is over a well (e.g., an implanted tank region), and also include a transistor coupled to a normally biased contact of the fuse (the active fuse contact), where the transistor can be a bipolar transistor or a metal oxide semiconductor (MOS) transistor. In the case of a MOS transistor, the well is connected to the MOS gate, the MOS source can be connected to the active fuse contact, and the MOS drain can be connected to its gate electrode via a first resistor (Hi-Z clamp resistor). Disclosed fuse circuits provides a fail-safe mode that blocks through current from the fuse in the case of FOX damage under the fuse body due to fuse blowing to provide high reliability ICs for ICs that include one or more fuses utilizing electrical fuse blowing.

BRIEF DESCRIPTION OF THE DRAWINGS

Reference will now be made to the accompanying drawings, which are not necessarily drawn to scale, wherein.

DETAILED DESCRIPTION

Figure 1A:
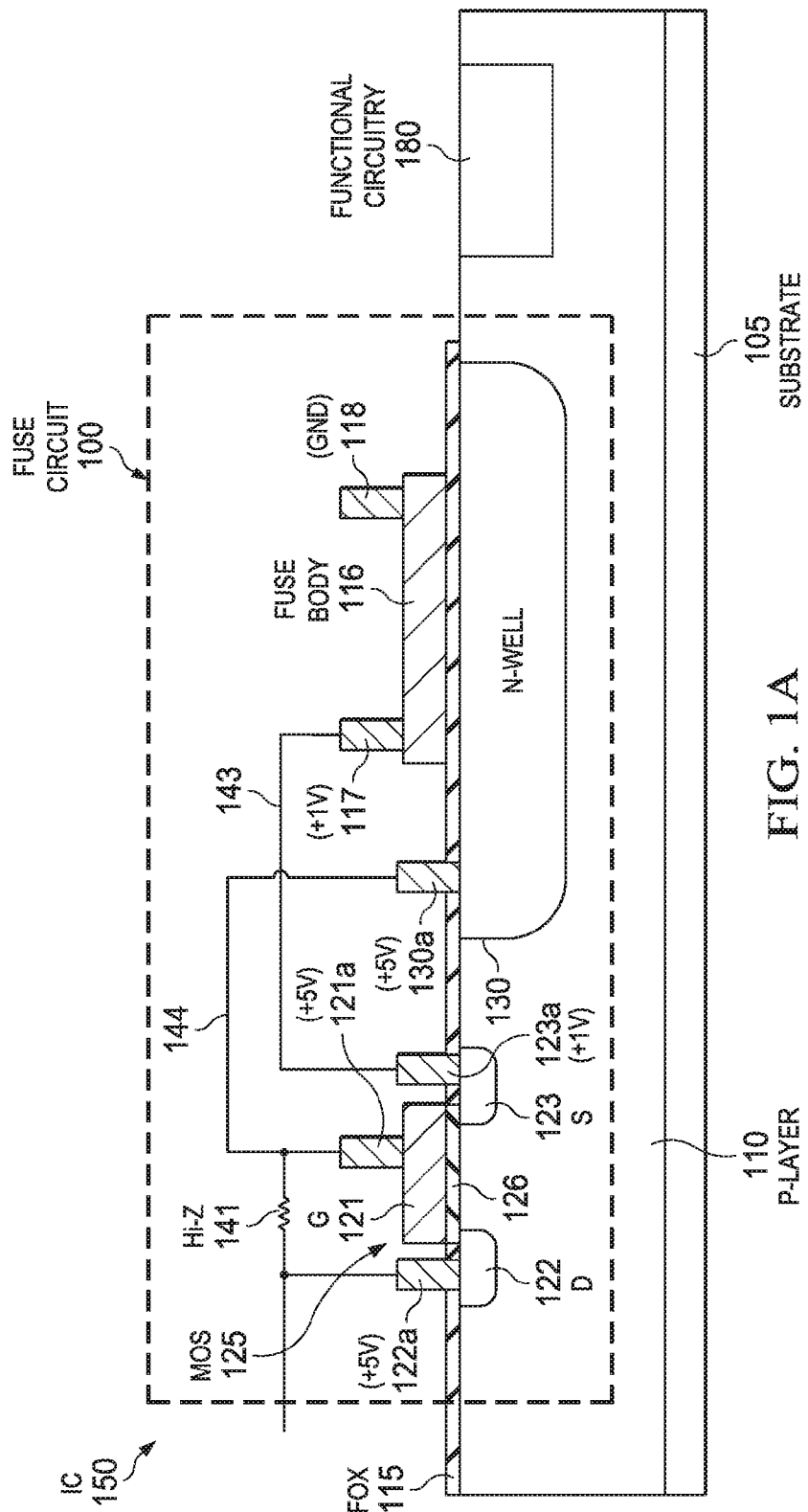
FIG. 1A is a cross sectional depiction of an example fuse circuit comprising a MOS transistor coupled to an active fuse contact of a fuse on a FOX layer over a well before fuse blowing.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1B:
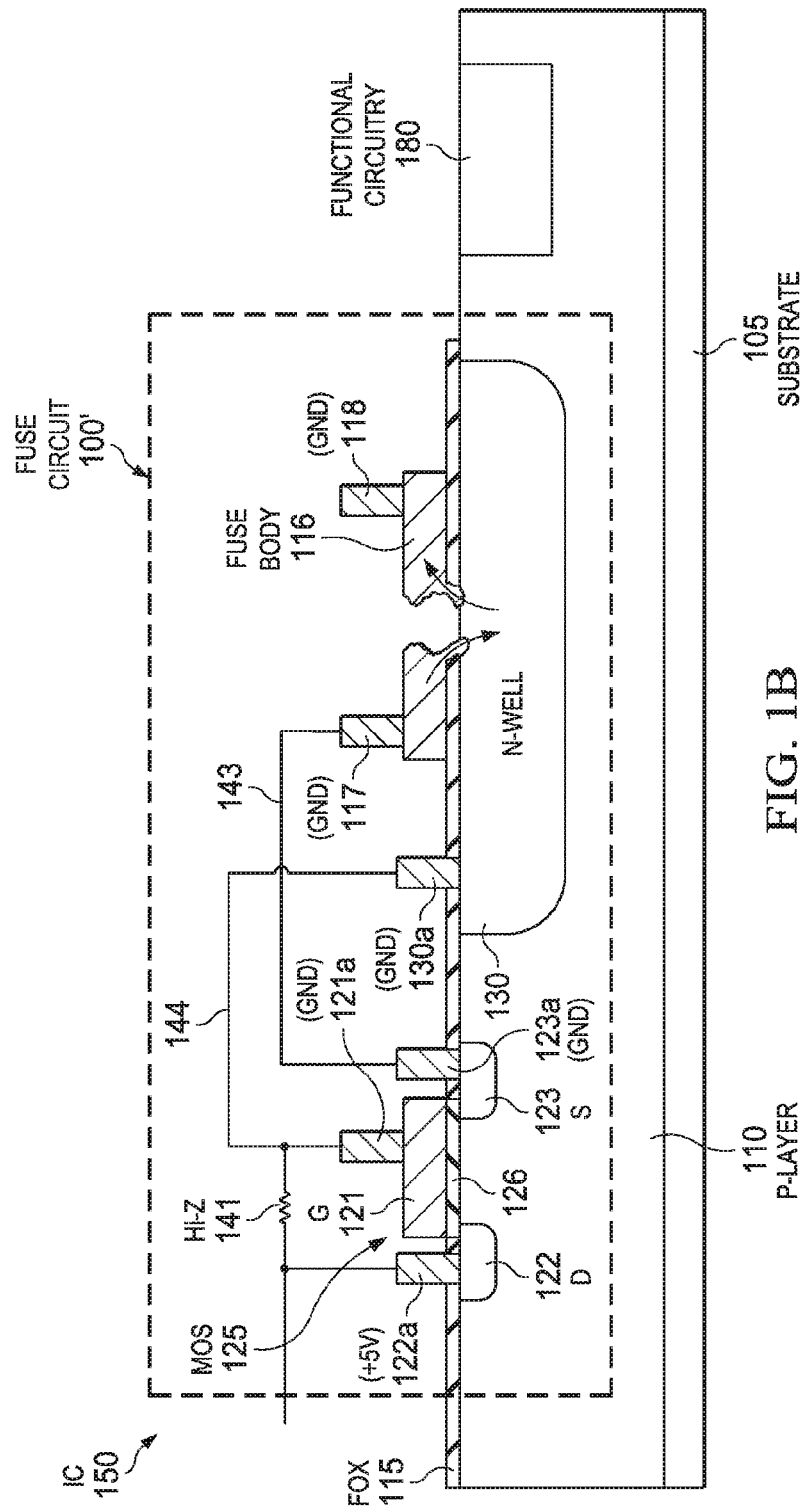
FIG. 1B shows the fuse circuit after fuse blowing, according to an example embodiment.

FIG. 1A is a cross sectional depiction of an example integrated circuit (IC) 150 including functional circuitry 180 and a disclosed fuse circuit 100 comprising a MOS transistor 125 coupled to an active fuse contact of a fuse 116, 117, 118 on a field dielectric layer shown as a field oxide (FOX) layer 115 over a well 130 shown as an n-well in FIG. 1A before fuse blowing, while FIG. 1B shows the fuse circuit as fuse circuit 100' after fuse blowing, according to an example embodiment. The functional circuitry 180 is integrated circuitry that realizes and carries out desired functionality of IC 150, such as that of a digital IC (e.g., digital signal processor), analog IC (e.g., amplifier or power converter), or a BiMOS IC. The capability of functional circuitry 180 provided by IC 150 may vary, for example ranging from a simple device to a complex device. The specific functionality contained within functional circuitry 180 is not of importance to disclosed embodiments. There are typically a plurality of disclosed fuse circuits 100 on each IC.

In manufacturing analog ICs, such as operational amplifiers (op-amps), the basic building blocks may not be accurately controlled by the manufacturing process as may be desired, such as capacitors and resistors may have the wrong value, and the MOS transistors may have the wrong gain setting. However, analog ICs may need accurate voltage references, frequency references, and accurately ratioed elements, or other parameters such as a low input offset voltage (VIO) for op-amps. To compensate for the process variability on such analog ICs, the analog IC can utilize analog trimming during wafer probe to set resistor values as necessary for proper operation of the circuit. A typical trimming technique utilizes a resistor ladder comprising a series of serially coupled resistors each in parallel with a fuse. Disclosed fuse circuits 100 can be used on such analog ICs as the fuses.

IC 150 includes a substrate 105 doped a first conductivity type including a top semiconductor layer (semiconductor layer) doped the first conductivity type shown as a p-type layer 110, and a well 130 doped a second conductivity type (doped n-type) shown as an nwell 130 formed in the p-type layer 110. The well 130 includes a well contact 130a that is generally highly doped, here n+ doped. FOX layer 115 is on the p-type layer 110. The fuse 116, 117, 118 is within the well 130 which provides a "tank" for the fuse.

The fuse 116, 117, 118 includes a fuse body 116 generally comprising a strip of an electrically conductive material having a first fuse contact 117 (e.g., metal contact, described as being the active contact) to the conductive material of the fuse body 116 and a second fuse contact 118 (e.g., metal contact, described and shown as being grounded) to the fuse body 116 separated from the first fuse contact 117. The first fuse contact 117 and the second fuse contact 118 are generally on opposite sides of the fuse. Second fuse contact 118 is generally internally grounded, such as by being connected to a GND bus line on the IC 150, but second fuse contact 118 can also be connected to a bond pad that is grounded externally during operation of the IC 150.

The MOS transistor 125 is formed in and on the p-type layer 110 adjacent to the fuse 116, 117, 118. For example, the MOS transistor 125 is typically spaced around 10 µm from the fuse, but can be closer such as a few µms away, or further away such as up to 100 µm or more as long as die area allows such spacing. The MOS transistor 125 can be in a layout next to the fuse or be configured to surround the fuse.

The MOS transistor 125 includes a gate electrode 121 (e.g., polysilicon) acting as its control terminal (CT) over a gate dielectric layer 126, a drain 122 acting as its first terminal (FT) having a drain contact 122a, and a source 123 acting as a second terminal (ST) having a source contact 123a. Although not shown, a body contact to the p-type layer 110 is also generally provided. A coupling path 144 (e.g. a metal line) is shown between the gate contact 121a and the well contact 130a. A first resistor (shown as a Hi-Z element) 141 is shown coupled between the drain contact 122a and the gate contact 121a.

A central concept for disclosed fuse circuits including fuse circuit 100 shown in FIG. 1A (and bipolar-based fuse circuit 200 shown in FIG. 2A described below) is to maintain the fuse circuit (MOS transistor 125 and fuse for fuse circuit 100 shown in FIG. 1A) in a Hi-Z condition between the drain contact 122a and the second fuse contact 118 even after blown fuse body material (e.g., polysilicon) from the fuse body shorts at least one of the fuse contacts (117, 118, or both 117 and 118, to the well 130 (or p-type layer 110) thereunder through damaged FOX layer 115. This Hi-Z protected arrangement situation provided herein is referred to as "failsafe" because between drain contact 122a and second fuse contact 118 acts as Hi-Z in any situation even with FOX layer damage (under fuse body 116) that causes leakage or a short from the first fuse contact 117 and/or second fuse contact 118 to the well 130 or to the p-type layer 110. Thus, fuse circuit 100 is failsafe despite damage to FOX layer 115 under the fuse 116, 117, 118 during fuse blowing that provides a leakage path (or a short) from the first fuse contact 117 and/or second fuse contact 118 to the semiconductor thereunder. Accordingly, IC 150 continues to operate normally including providing the same functionality(ies) and parametric performance provided by its functional circuitry 180.

The drain 122 and gate electrode 121 are shown biased at 5V, such as by a conventional external blow/sense circuit. Before fuse blowing as shown in FIG. 1A, the MOS transistor 125 is turned ON by the applied bias (so that $V_{GS}>V_T$) with the 1V level shown at source 123 being from an example voltage divider estimate with 5V applied to the drain 122 and to the gate electrode 121.

The first resistor 141 can have a resistance of between 10 kohms and 100 Mohms. First resistor 141 typically comprises polysilicon, a thin film resistor (TFR) material, or a junction diffused resistor. There is also a low resistance coupling path 143 between the source contact 123a and the first fuse contact 117. During operation of the IC 150, whether before or after fuse blowing, the MOS transistor 125 is coupled so that a level of a current resulting from a voltage applied (e.g., by a blow/sense circuit) between the drain 122 and the source 123 is controlled by the bias applied to the gate electrode 121.

After fuse blowing example voltages are shown in FIG. 1B for fuse circuit 100' being 5V on drain contact 122a (same as for fuse circuit 100 shown in FIG. 1A), but now unlike fuse circuit 100 shown in FIG. 1A both the gate electrode 121 and source 123 become grounded so that MOS transistor 125 is turned OFF. As a result, fuse blowing resulting damage to the FOX layer 115 such as so that conductive material from the fuse body 116 provides an electrical path from the first fuse contact 117 to second fuse contact 118 (grounded) of the fuse through the well 130 (or semiconductor layer if no well is present) is not a problem because the MOS transistor 125 is OFF it acts to shut off (block) the current that would otherwise flow between the drain 122 and second fuse contact 118 because the total current path is shut down.

Figure 2A:
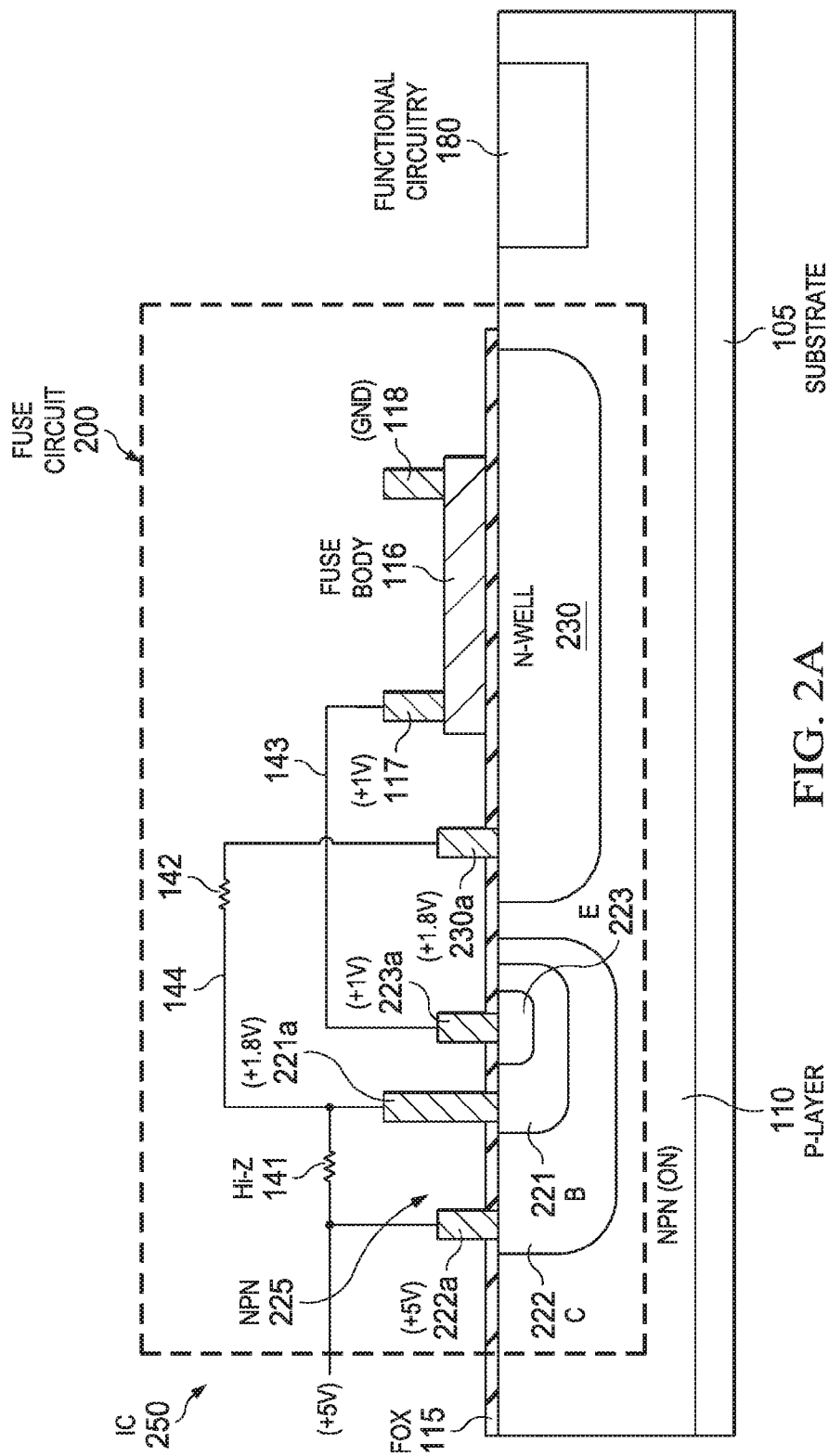
FIG. 2A is a cross sectional depiction of an example fuse circuit comprising a bipolar transistor coupled to an active fuse contact of a fuse on a FOX layer over a well before fuse blowing.
Figure 2B:
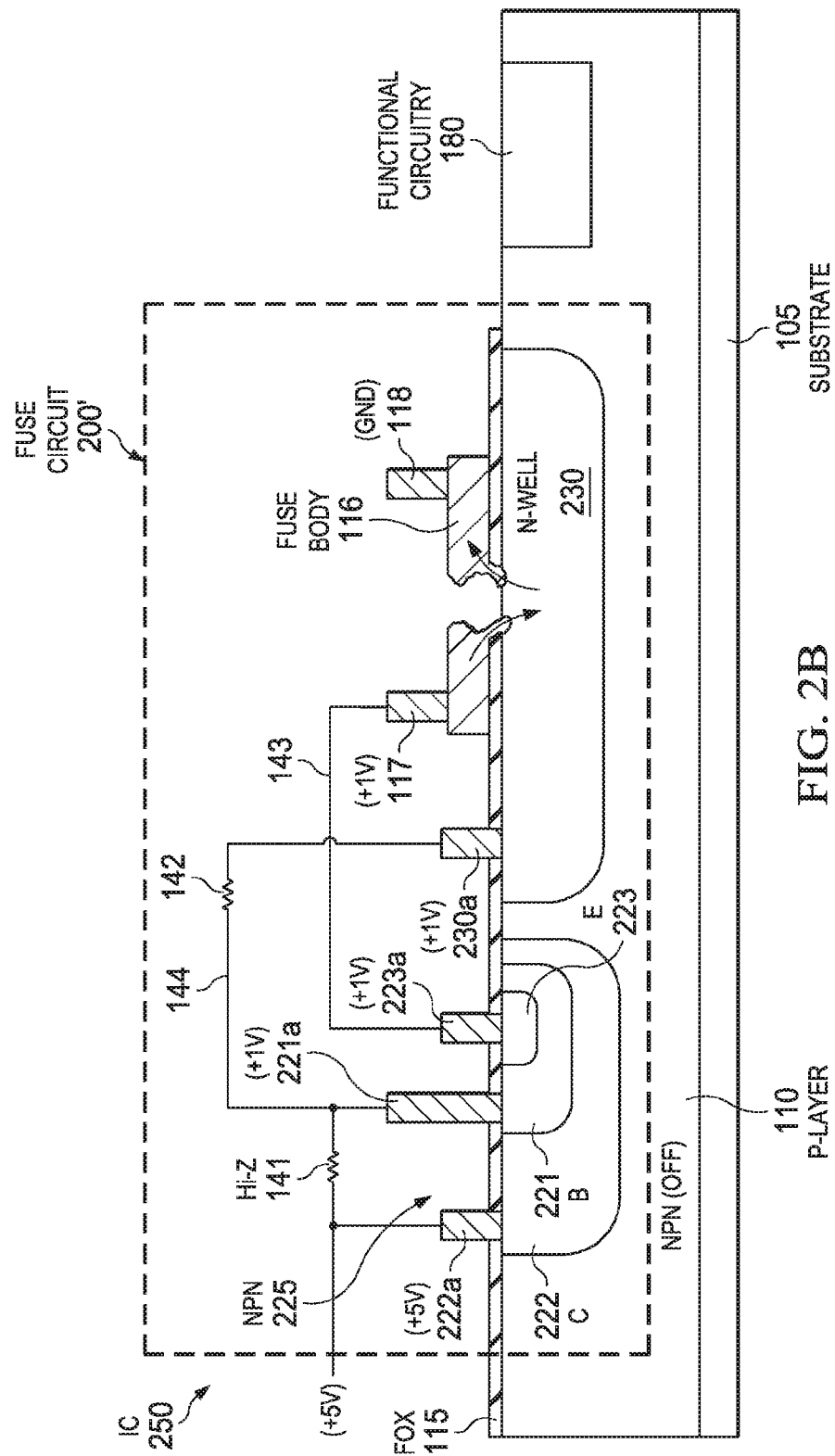
FIG. 2B shows the fuse circuit after fuse blowing, according to an example embodiment.

FIG. 2A is a cross sectional depiction of an example IC 250 including functional circuitry 180 and a disclosed fuse circuit 200 comprising a bipolar transistor 225 coupled to a fuse 116, 117, 118 on a FOX layer 115 over a well 230 before fuse blowing, and FIG. 2B shows the fuse circuit as fuse circuit 200' after fuse blowing, according to an example embodiment. The bipolar transistor 225 includes a base 221 acting as its CT having a base contact 221a, and collector 222 acting as its FT having a collector contact 222a, and an emitter 223 acting as a ST having n-emitter contact 223a. A coupling path 144 is shown between the base contact 221a and the well contact 130a. For fuse circuit 200 where the transistor comprises a bipolar transistor 225, the fuse circuit 200 generally further comprises the second resistor 142 shown positioned in the coupling path 144.

The second resistor 142 is generally lower in resistance compared to the first resistor 141, such as a resistance of the first resistor 141 being 2 to 40 times a resistance of the second resistor 142. Resistor 142 provides a protective resistance provided in case excess current is injected through the base 221, so that the second resistor 142 is not needed in MOS version of the fuse circuit 100 shown in FIG. 1A. Provided the second resistor 142 is lower in resistance compared to the first resistor 141, resistor 142 can have a resistance from about 1 kohm to 10 Mohm.

Disclosed fuse circuits have structures which enable implementing fuses on a thin FOX layer 115, such as 0.05 µm to 0.3 µm thick, being about 0.1 µm thick in one particular embodiment. No additional mask levels are generally needed to conventionally provide a thicker FOX under the fuse, especially for processes which have only one thin FOX. Disclosed fuse circuits thus enhance the flexibility of FOX layer selection, and IC design regarding fuse placement overcoming the known design difficulty in placement fuses on thin FOX layers because of concern of FOX layer damage during the fuse blowing. Disclosed fuse circuits also enhance reliability robustness for ICs having fuses due to the failsafe mode provided which as described above implements blocking of the otherwise current flowing through the FOX layer under the fuse in case of damaged FOX, thus providing higher reliability ICs which include fuses that utilize electrical fuse blowing.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A fuse circuit, comprising:
   a substrate including a top semiconductor layer (semiconductor layer) doped a first conductivity type having a well doped a second conductivity type opposite said first conductivity type formed in said semiconductor layer, said well including a well contact;
   a field dielectric layer on said semiconductor layer;
   a fuse on said dielectric layer within said well including a fuse body comprising a strip of an electrically conductive material having a first fuse contact on said conductive material and a second fuse contact on said conductive material separated from the first fuse contact;
   a transistor formed in said semiconductor layer adjacent to said fuse, said transistor including a control terminal (CT) with a CT contact and a first terminal (FT) having a FT contact and a second terminal (ST) having a ST contact;
   a coupling path between said CT contact and said well contact;
   a first resistor coupled between said FT contact and said CT contact, and
   a coupling path between said ST contact and said first fuse contact.

2. The fuse circuit of claim 1, wherein said transistor comprises a bipolar transistor, further comprising a second resistor in said coupling path, said second resistor being lower in resistance as compared to said first resistor.

3. The fuse circuit of claim 2, wherein a resistance of said first resistor is 2 to 40 times said resistance of said second resistor.

4. The fuse circuit of claim 1, wherein said transistor comprises a metal-oxide-semiconductor (MOS) transistor.

5. The fuse circuit of claim 1, wherein said conductive material comprises polysilicon, tungsten, or aluminum.

6. The fuse circuit of claim 1, wherein said dielectric layer comprises a field oxide (FOX) layer that is from 0.05 µm to 0.3 µm thick.

7. The fuse circuit of claim 1, wherein said second fuse contact is internally grounded on an integrated circuit (IC) that includes said fuse circuit.

8. The fuse circuit of claim 1, wherein said wherein said substrate and said semiconductor layer both comprise silicon.

9. An integrated circuit (IC), comprising:
   a substrate including a top semiconductor layer (semiconductor layer) doped a first conductivity type having a well doped a second conductivity type opposite said first conductivity type formed in said semiconductor layer, said well including a well contact;
   functional circuitry formed in said semiconductor layer;
   a field dielectric layer on said semiconductor layer;
   at least one fuse on said dielectric layer within said well including a fuse body comprising a strip of an electrically conductive material having a first fuse contact on said conductive material and a second fuse contact on said conductive material separated from the first fuse contact;
   a transistor formed in said semiconductor layer adjacent to said fuse, said transistor including a control terminal (CT) with a CT contact and a first terminal (FT) having a FT contact and a second terminal (ST) having a ST contact;
   a coupling path between said CT contact and said well contact;
   a first resistor coupled between said FT contact and said CT contact, and
   a coupling path between said ST contact and said first fuse contact.

10. The IC of claim 9, wherein said substrate and said semiconductor layer both comprise silicon.

11. The IC of claim 9, wherein said transistor comprises a bipolar transistor, further comprising a second resistor in said coupling path, said second resistor being lower in resistance as compared to said first resistor.

12. The IC of claim 11, wherein a resistance of said first resistor is 2 to 40 times said resistance of said second resistor.

13. The IC of claim 9, wherein said transistor comprises a metal-oxide-semiconductor (MOS) transistor.

14. The IC of claim 9, wherein said conductive material comprises polysilicon, tungsten, or aluminum.

15. The IC of claim 9, wherein said dielectric layer comprises a field oxide (FOX) layer that is from 0.05 µm to 0.3 µm thick.

16. The IC of claim 9, wherein said second fuse contact is internally grounded on said IC.

17. The IC of claim 9, wherein said functional circuitry comprises an analog IC having a plurality of said fuse circuits for fuse trimming at least one parameter of said analog IC.

18. The IC of claim 17, wherein said analog IC comprises an operational amplifier.

* * * * *